(12) United States Patent
Wu et al.

(10) Patent No.: US 11,183,414 B2
(45) Date of Patent: Nov. 23, 2021

(54) SECONDARY PACKAGING METHOD AND SECONDARY PACKAGE OF THROUGH SILICON VIA CHIP

(71) Applicant: SHENZHEN GOODIX TECHOLOGY CO., LTD., Guangdong (CN)

(72) Inventors: Baoquan Wu, Guangdong (CN); Wei Long, Guangdong (CN); Yuping Liu, Guangdong (CN)

(73) Assignee: Shenzhen Goodix Technology Co., Ltd., Guangdong (CN)

(*) Notice: Subject to any disclaimer, the term of this patent is extended or adjusted under 35 U.S.C. 154(b) by 0 days.

(21) Appl. No.: 16/139,994

(22) Filed: Sep. 24, 2018

(65) Prior Publication Data
US 2019/0027390 A1    Jan. 24, 2019

Related U.S. Application Data

(63) Continuation of application No. PCT/CN2017/094695, filed on Jul. 27, 2017, which is
(Continued)

(51) Int. Cl.
*H01L 21/68* (2006.01)
*H01L 21/683* (2006.01)
(Continued)

(52) U.S. Cl.
CPC ...... *H01L 21/6835* (2013.01); *G06K 9/00053* (2013.01); *H01L 21/56* (2013.01);
(Continued)

(58) Field of Classification Search
CPC .......... H01L 21/6835; H01L 23/3114; H01L 21/565; H01L 21/561; H01L 21/56;
(Continued)

(56) References Cited

U.S. PATENT DOCUMENTS 5,923,954 A    7/1999   Cho
8,717,775 B1*  5/2014   Bolognia ............... H01L 24/06
                                                      361/803
(Continued)

FOREIGN PATENT DOCUMENTS

CN    101290893 A    10/2008
CN    101465299 A    6/2009
(Continued)

OTHER PUBLICATIONS

Extended European Search Report for European Application No. 17896308.8 dated Jun. 27, 2019.
(Continued)

*Primary Examiner* — Charles D Garber
*Assistant Examiner* — S M Sohel Imtiaz
(74) *Attorney, Agent, or Firm* — Heslin Rothenberg Farley & Mesiti P.C.

(57) ABSTRACT

In semiconductor packaging technologies, a secondary packaging method of a TSV chip and a secondary package of a TSV chip are provided. The TSV chip has a forward surface and a counter surface that are opposite to each other, a BGA solder ball is disposed on the counter surface, and the secondary packaging method includes: placing at least one TSV chip on a base on which a stress relief film layer is laid; cladding the TSV chip via a softened molding compound; removing the base after the molding compound is cured, to obtain a secondary package of the TSV chip; and processing a surface of the secondary package to expose the BGA solder ball.

11 Claims, 12 Drawing Sheets

Related U.S. Application Data a continuation of application No. PCT/CN2017/073354, filed on Feb. 13, 2017.

(51) Int. Cl.

| | | |
|---|---|---|
| *H01L 23/31* | (2006.01) | |
| *H01L 23/00* | (2006.01) | |
| *H01L 21/768* | (2006.01) | |
| *H01L 21/56* | (2006.01) | |
| *H01L 27/146* | (2006.01) | |
| *G06K 9/00* | (2006.01) | |
| *H01L 23/498* | (2006.01) | |

(52) U.S. Cl.
CPC .......... *H01L 21/561* (2013.01); *H01L 21/565* (2013.01); *H01L 21/568* (2013.01); *H01L 21/76898* (2013.01); *H01L 23/31* (2013.01); *H01L 23/3114* (2013.01); *H01L 23/49827* (2013.01); *H01L 24/26* (2013.01); *H01L 24/96* (2013.01); *H01L 27/14618* (2013.01); *H01L 27/14625* (2013.01); *H01L 27/14636* (2013.01); *H01L 27/14685* (2013.01); *H01L 27/14698* (2013.01); *H01L 24/13* (2013.01); *H01L 2221/68327* (2013.01); *H01L 2224/13025* (2013.01); *H01L 2224/13101* (2013.01); *H01L 2924/18161* (2013.01); *H01L 2924/3511* (2013.01)

(58) Field of Classification Search
CPC ... H01L 24/96; H01L 21/76898; H01L 24/26; H01L 23/31; H01L 24/13; H01L 27/14625; H01L 27/14636; H01L 27/14685; H01L 27/14698; H01L 27/14618; H01L 23/49827; G06K 9/00053

See application file for complete search history.

(56) References Cited

U.S. PATENT DOCUMENTS

| | | | |
|---|---|---|---|
| 9,437,566 B2 | 9/2016 | Katkar et al. | |
| 9,524,906 B1 | 12/2016 | Paek et al. | |
| 2003/0071354 A1* | 4/2003 | Tsai | H01L 24/12 257/738 |
| 2010/0029045 A1* | 2/2010 | Ramanathan | H01L 24/19 438/114 |
| 2012/0153498 A1* | 6/2012 | Kang | H01L 23/3114 257/774 |
| 2013/0037935 A1* | 2/2013 | Xue | H01L 23/3114 257/737 |
| 2013/0113098 A1 | 5/2013 | Hwang et al. | |
| 2013/0234308 A1 | 9/2013 | Yamada et al. | |
| 2013/0330922 A1* | 12/2013 | Oliver | H01L 24/05 438/613 |
| 2014/0008795 A1* | 1/2014 | Kim | H01L 21/56 257/738 |
| 2015/0123285 A1* | 5/2015 | Lin | H01L 21/481 257/774 |
| 2015/0192711 A1* | 7/2015 | Okada | G02B 5/1852 359/576 |
| 2016/0218129 A1* | 7/2016 | Liu | H01L 27/14687 |
| 2016/0247009 A1* | 8/2016 | Lu | H01L 23/4985 |
| 2016/0372445 A1* | 12/2016 | Yiu | H01L 21/4846 |
| 2017/0140202 A1* | 5/2017 | Huang | G06K 9/00053 |
| 2017/0330017 A1* | 11/2017 | Chen | H01L 24/00 |

FOREIGN PATENT DOCUMENTS

| | | |
|---|---|---|
| CN | 103208430 A | 7/2013 |
| CN | 204011397 U | 12/2014 |
| CN | 104485320 A | 4/2015 |
| CN | 104495741 A | 4/2015 |
| CN | 104538373 A | 4/2015 |
| CN | 104576424 A | 4/2015 |
| CN | 104659005 A | 5/2015 |
| CN | 105390429 A | 3/2016 |
| CN | 105590911 A | 5/2016 |
| CN | 105810599 A | 7/2016 |
| CN | 106098717 A | 11/2016 |
| CN | 107026092 A | 8/2017 |
| CN | 207038516 U | 2/2018 |
| JP | 2003083708 A | 3/2003 |
| KR | 20150121759 A | 10/2015 |
| TW | 201606893 A | 2/2016 |
| WO | 2016037575 A1 | 3/2016 |

OTHER PUBLICATIONS

Chinese Office Action issued for Chinese Patent Application No. 201720925097.6 dated Sep. 16, 2019.

"Technologies of Electronic Manufacturing Equipments", http://www.xduph.com.

Summons to attend oral proceedings pursuant to Rule 115(1) EPC dated Apr. 19, 2021.

* cited by examiner

101

SECONDARY PACKAGING METHOD AND SECONDARY PACKAGE OF THROUGH SILICON VIA CHIP

CROSS REFERENCE TO RELATED APPLICATIONS

This disclosure is a continuation of international application No. PCT/CN2017/094695, filed on Jul. 27, 2017, which claims priority of international patent application No. PCT/CN2017/073354 filed on Feb. 13, 2017, titled "SECONDARY PACKAGING METHOD AND SECONDARY PACKAGE OF THROUGH SILICON VIA CHIP", both of which are incorporated into this disclosure by reference in their entireties.

TECHNICAL FIELD

Embodiments of this disclosure relate to semiconductor packaging technologies, and particularly relate to a secondary packaging method and a secondary package of a through silicon via (TSV) chip.

BACKGROUND

An electronic product with a fingerprint identification function, as the demand of complete machine design, is gradually developed towards the miniaturization and thinning directions, and thus, higher and higher demands for a thickness of a fingerprint identification chip are also proposed, and moreover, in a case of meeting the requirements for chip packaging sizes, a package also needs to have excellent mechanical structural strength and low warpage.

However, the inventor(s) find that existing packaging solutions for a fingerprint identification chip at least have technical problems below: a substrate 101 needs to be used as a carrier for performing a secondary packaging process, no matter for a wire bond packaging by employing a trench process or a TSV packaging (FIG. 1 shows a sectional schematic diagram of a TSV chip, and FIG. 2 shows a sectional schematic diagram after a secondary packaging process is performed by using the substrate 101). After the substrate is used as the carrier for packaging, a thickness of the whole package may generally exceed 0.5 mm, a warpage of a single package may be approximate to 50 μm, and such packaging size cannot meet the design demands for gradual miniaturization and thinning of the electronic product.

SUMMARY

An embodiment of this disclosure is to provide a secondary packaging method and a secondary package of a TSV chip. In the secondary packaging process, there is no need to use a substrate as a carrier, and thus, on the basis of guaranteeing the TSV chip to have relatively high mechanical structural strength, a thickness of the secondary package is reduced, a thinning and miniaturization design of an electronic product is facilitated.

In order to solve the above-mentioned technical problems, an embodiment of this disclosure provides a secondary packaging method of a TSV chip. The TSV chip has a forward surface and a counter surface that are opposite to each other, the counter surface is disposed with a ball grid array (BGA) solder ball thereon, and the secondary packaging method of the TSV chip includes: placing at least one TSV chip on a base on which a stress relief film layer is laid, wherein the forward surface of the TSV chip is in contact with the stress relief film layer; cladding the TSV chip via a softened molding compound; removing the base after the molding compound is cured, so as to obtain a secondary package of the TSV chip; and performing a process on a surface of the secondary package to expose the BGA solder ball, wherein the processed surface of the secondary package corresponds to the counter surface of the TSV chip.

An embodiment of this disclosure further provides a secondary package of a TSV chip, including: a TSV chip and a molding compound; the TSV chip has a forward surface, a counter surface and a plurality of side surfaces; the counter surface of the TSV chip is disposed with a solder ball thereon; and the molding compound dads the counter surface and the plurality of side surfaces of the TSV chip, and the solder ball is exposed out of the surface of the molding compound.

Compared to the existing technology, in the embodiments of this disclosure, the secondary package in a non-substrate form is obtained by employing the stress relief film layer and separating the secondary package of the TSV chip from the base on which the stress relief film layer is laid after the molding compound is cured, so that based upon guaranteeing the TSV chip to have relatively high mechanical structural strength, the thickness of the secondary package of the TSV chip, as compared to that of a substrate packaging form, is reduced, and the thinning and miniaturization design of the electronic product is facilitated.

In addition, the step of cladding the TSV chip via the softened molding compound specifically includes: pressing an injection mold with a cavity on the base, and enabling the TSV chip to be positioned in the cavity; injecting the softened molding compound into the cavity to clad the TSV chip with the molding compound. The embodiment provides a first specific embodiment of cladding the TSV chip via the softened molding compound, i.e., a manner of injecting the softened molding compound by adopting an injection mold.

In addition, the step of cladding the TSV chip via the softened molding compound specifically includes: coating the softened molding compound on the TSV chip; and pressing on the softened molding compound and the TSV chip by utilizing a press mold so as to clad the TSV chip with the molding compound. The embodiment provides a second specific implementation mode for cladding the TSV chip via the softened molding compound, i.e., a manner of adopting direct coating and pressing.

In addition, the step of performing the process on the surface of the secondary package to expose the BGA solder ball specifically includes: grinding the surface of the secondary package to expose the BGA solder ball. The embodiment provides a first specific implementation mode for exposing the BGA solder ball, i.e., removing a part of the molding compound and a part of the BGA solder ball through grinding.

In addition, the exposed surface of the BGA solder ball is of a circle shape, a distance between the exposed surface of the BGA solder ball and the counter surface of the TSV chip is equal to a radius of the circle, and in this case, the exposed surface of the BGA solder ball has a maximum area, which helps to improve reliability of electrical interconnection of the BGA solder ball and the outside.

In addition, after the step of performing the process on the surface of the secondary package to expose the BGA solder ball, the secondary packaging method further includes: disposing an auxiliary solder ball on the BGA solder ball, wherein the auxiliary solder ball is above the surface. If the portion of the BGA solder ball, which is removed by grinding, is excessive or insufficient, or if the area of the exposed surface of the BGA solder ball is not large enough, the BGA solder ball is disposed with the auxiliary solder ball thereon, which is equivalent to that the exposed area of the BGA solder ball is increased, so that reliability of electrical interconnection of the BGA solder ball and the outside is further improved.

In addition, the step of performing the process on the surface of the secondary package to expose the BGA solder ball specifically includes: partially removing a portion of the molding compound in the secondary package, which corresponds to the BGA solder ball, to expose the BGA solder ball; and after performing the process on the surface of the secondary package to expose the BGA solder ball, the secondary packaging method further includes: disposing an auxiliary solder ball on the BGA solder ball, wherein the auxiliary solder ball is above or flush with the surface. The embodiment provides a second specific implementation mode for exposing the BGA solder ball, i.e., partially removing the molding compound and disposing the auxiliary solder ball.

In addition, a method for partial removing includes one or any combination of a laser method, an ion bombardment method and a chemical corrosion method.

In addition, a plurality of TSV chips are provided; and after performing the process on the surface of the secondary package to expose the BGA solder ball, the secondary packaging method further includes: cutting the secondary package to obtain a single secondary package of the TSV chip.

In addition, in the case that the exposed surface of the auxiliary solder ball is above the surface of the molding compound, the exposed surface of the auxiliary solder ball is above the surface of the molding compound by a distance of 50 µm to 300 µm, so that the auxiliary solder ball has the sufficient exposed area to ensure reliability of electrical connection with the outside, and meanwhile, a whole thickness of the secondary package of the TSV chip is as small as possible.

In addition, the TSV chip is a fingerprint identification chip, and the forward surface of the TSV chip includes a fingerprint identification sensing region.

BRIEF DESCRIPTION OF THE DRAWINGS

One or more embodiments are exemplarily illustrated by figures in the corresponding accompanying drawings, those exemplary illustrations do not constitute limitation to the embodiments, components with the same reference numbers in the accompanying drawings represent similar components, and unless specified otherwise, the figures in the accompanying drawings do not constitute proportional limitation.

DETAILED DESCRIPTION

In order to make objects, technical solutions and advantages of embodiments of this disclosure more apparent, each embodiment of this disclosure will be illustrated in detail in connection with the accompanying drawings. However, those skilled in the art can understand that in each embodiment of this disclosure, many technical details are proposed in order to make readers understand this disclosure better. But even if there are no those technical details and various changes and modifications based on each embodiment hereinafter, the technical solutions claimed for protection by this disclosure can also be implemented.

Figure 1:
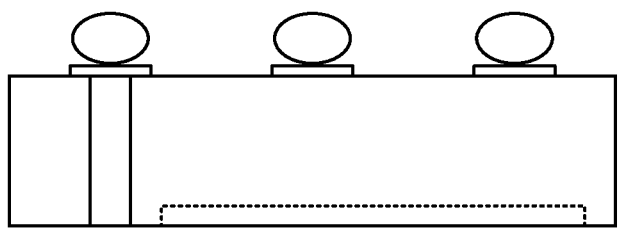
FIG. 1 is a sectional schematic diagram of a TSV chip according to the existing technology.
Figure 2:
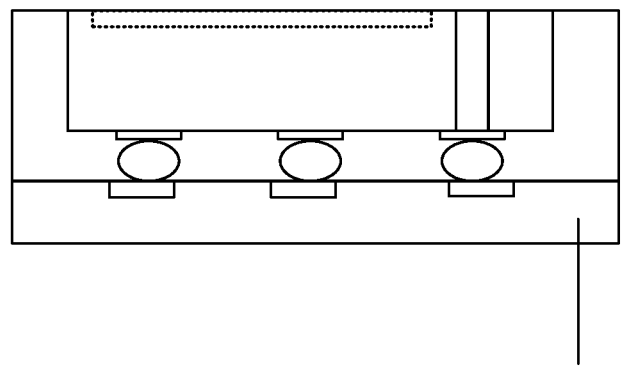
FIG. 2 is a sectional schematic diagram of a secondary package of a TSV chip, which employs a substrate, according to the existing technology.
Figure 3:
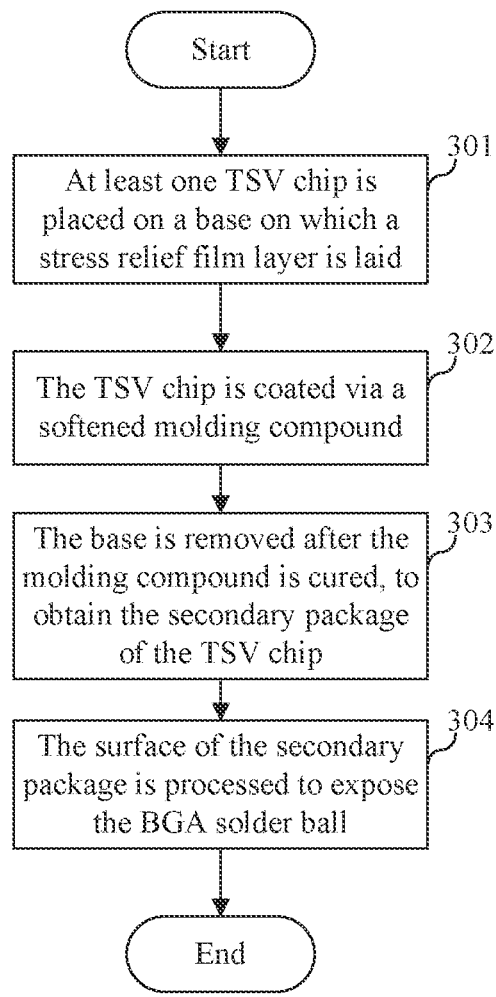
FIG. 3 is a specific flow chart of a secondary packaging method of a TSV chip according to a first embodiment of this disclosure.

A first embodiment of this disclosure relates to a secondary packaging method of a TSV chip, the specific process of which is as shown in FIG. 3.

S301: at least one TSV chip 1 is placed on a base 41 on which a stress relief film layer 3 is laid.

Figure 4:
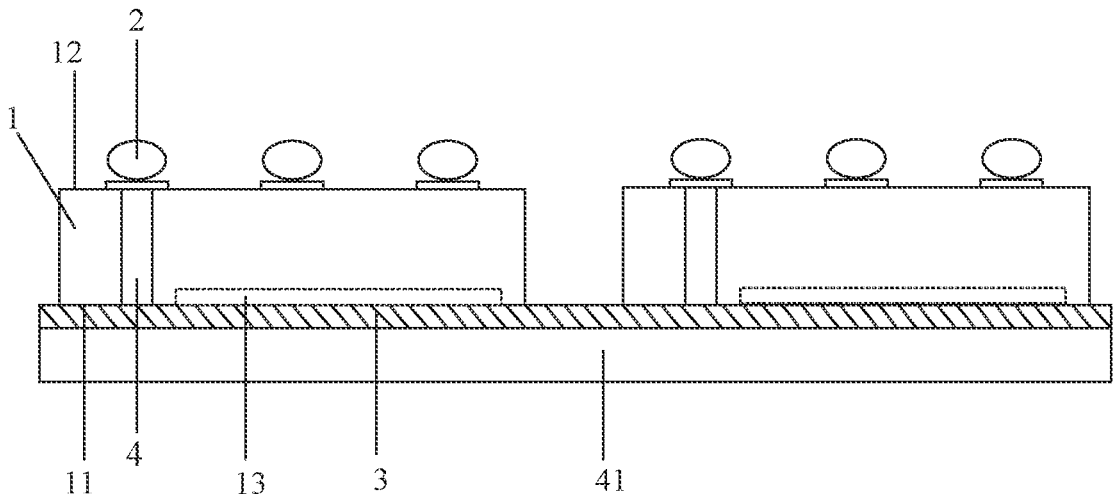
FIG. 4 is a sectional schematic diagram that the TSV chip is placed on a base according to the first embodiment of this disclosure.

With reference to FIG. 4, the TSV chip 1 has a forward surface 11 and a counter surface 12 that are opposite to each other, and the counter surface 12 is disposed with a BGA solder ball 2 thereon. The TSV chip 1 includes a through silicon via 4. In the embodiment, the TSV chip is a fingerprint identification chip, and the forward surface 11 further includes a fingerprint identification sensing region 13.

In the secondary packaging process provided by the embodiment, the base 41 is used for carrying the TSV chip 1. After the TSV chip 1 is placed on the stress relief film layer 3, the stress relief film layer 3 can take an effect of fixing the TSV chip 1 due to a certain viscosity. The forward surface 11 of the TSV chip 1 includes the fingerprint identification sensing region 13 and does not need to be packaged via a molding compound, and thus, the forward surface 11 is in contact with the stress relief film layer 3.

A plurality of TSV chips 1 can be simultaneously subjected to secondary packaging, a rule of placing the plurality of TSV chips 1 on the base 41 may be set according to actual demands. For example, placement spacing among the plurality of TSV chips or number of the TSV chips may be determined according to a size of the base 41 or demands on a size of a secondary package.

Preferably, the forward surface 11 is provided with a protective layer (which is not shown in the figures), and the protective layer covers the fingerprint identification sensing region 13 so as to protect the fingerprint identification sensing region 13. The protective layer may have a thickness greater than or equal to 5 microns and smaller than or equal to 50 microns. For example, the thickness of the protective layer may be 5 microns, or 25 microns, or 50 microns; and a material of the protective layer may be organic colloid, and the protective layer may be coated on the forward surface 11. However, the embodiment does not limit the thickness, the material and the disposal manner of the protective layer.

S302: the TSV chip 1 is coated via a softened molding compound.

In the step, for the TSV chip 1, except that the forward surface 11 (including the fingerprint identification sensing region 13) is in contact with the stress relief film layer 3, the other five surfaces are all plastic packaged by the softened molding compound. The softened molding compound generally contains organic and inorganic materials, such as resin, silicon oil, silicon dioxide particles and the like.

S303: the base 41 is removed after the molding compound is cured, to obtain the secondary package of the TSV chip 1.

Figure 5:
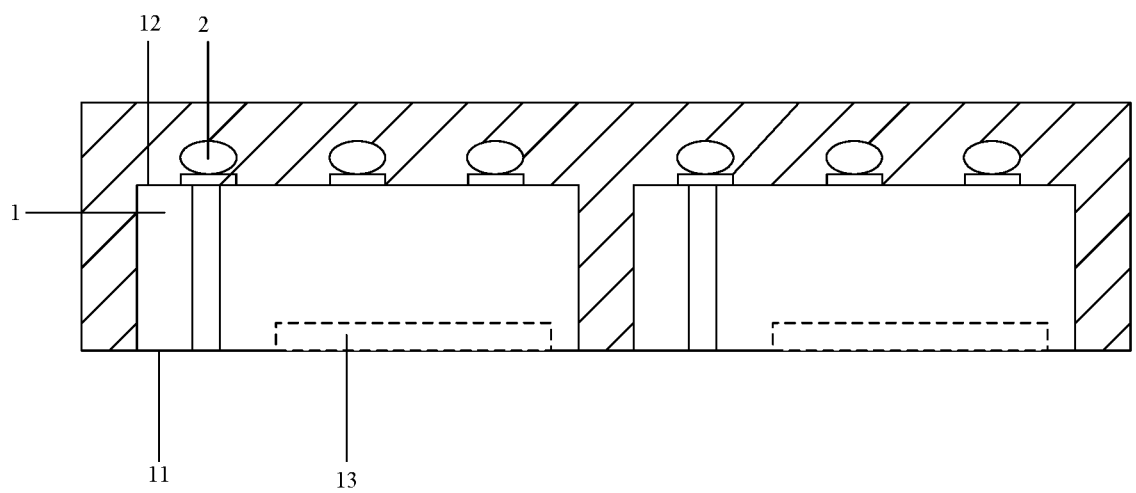
FIG. 5 is a sectional schematic diagram of a secondary package of a TSV chip, in which the base is removed, according to the first embodiment of this disclosure.

As shown in FIG. 5, in the case that a plurality of TSV chips 1 are simultaneously arranged on a substrate, the TSV chips 1 are surrounded and supported by the cured molding compound. Since the cured molding compound has certain strength, the whole secondary package with a plurality of TSV chips 1 can be formed. Since a bonding force between the stress relief film layer 3 and the molding compound is not very large, the secondary package can be separated from the base 41 on which the stress relief film layer 3 is laid, after the molding compound is cured, so as to obtain the secondary package of the TSV chip in a non-substrate form.

S304: the surface of the secondary package is processed to expose the BGA solder ball 2.

At this time, the BGA solder ball 2 is totally buried in the cured molding compound, and thus, the BGA solder ball 2 needs to be exposed out. The surface of the secondary package may be processed by a specific processing process, and the processed surface of the secondary package corresponds to the counter surface 12 of the TSV chip 1; namely, the BGA solder ball 2 disposed on the counter surface 12 of the TSV chip 1 is exposed, so that the TSV chip 1 is electrically interconnected with the outside only by the BGA solder ball 2.

It should be noted that, generally, in the case that the surface of the secondary package is processed, a part of the molding compound and a part of the BGA solder ball may be simultaneously removed; however, in some other cases, only the molding compound may be removed.

In the case that the secondary package of a plurality of TSV chips is obtained, the conjoined secondary package of the plurality of TSV chips may be cut to obtain a single secondary package of a TSV chip, after the surface of the secondary package is processed to expose the BGA solder ball.

Compared to the existing technology, in the secondary packaging method of the TSV chip provided by the embodiment, the secondary package in the non-substrate form can be obtained by employing the stress relief film layer and separating the secondary package of the TSV chip from the base on which the stress relief film layer is laid, after the molding compound is cured, so that based upon guaranteeing the TSV chip to have relatively high mechanical structural strength, the thickness of the secondary package of the TSV chip is reduced compared to that of a substrate packaging form, and the thinning and miniaturization design of an electronic product is facilitated.

A second embodiment of this disclosure relates to a secondary packaging method of a TSV chip. The second embodiment is a refinement on the first embodiment, and the main refinement is that: with reference to FIG. 6 and FIG. 7, the embodiment provides a first specific implementation mode for cladding the TSV chip 1 via softened molding compound 5, i.e., a method of injecting the molding compound by using an injection mold.

Figure 6:
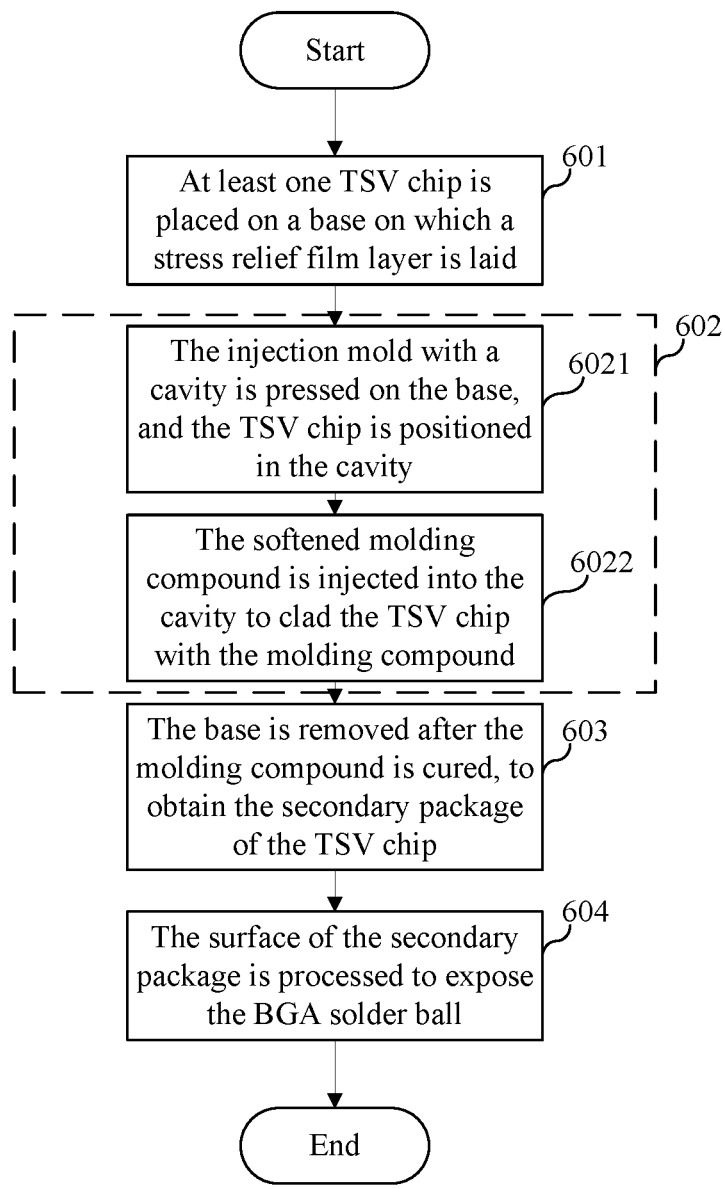
FIG. 6 is a specific flow chart of a secondary packaging method of a TSV chip according to a second embodiment of this disclosure.
Figure 7:
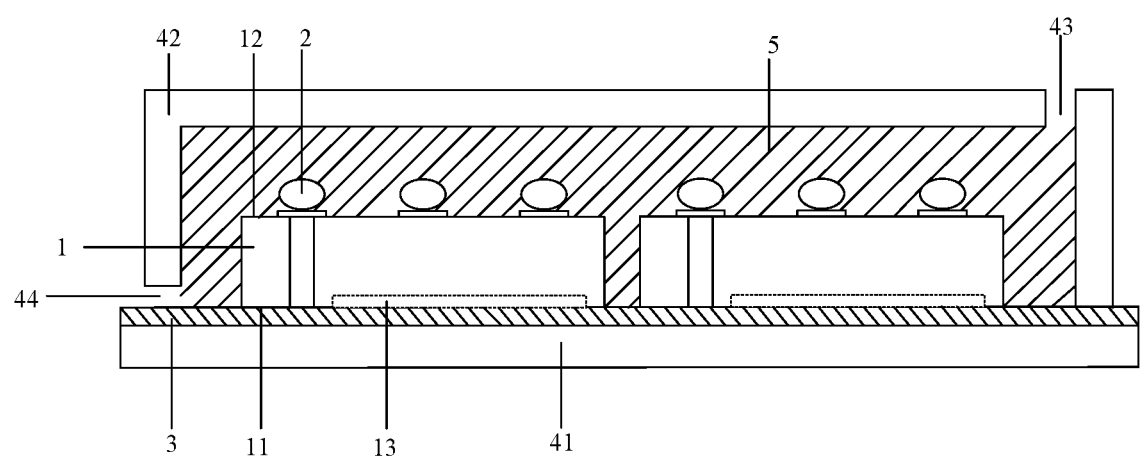
FIG. 7 is a structural schematic diagram of a first specific implementation mode for cladding the TSV chip via a softened molding compound according to the second embodiment of this disclosure.

The specific flow of the secondary packaging method of the TSV chip, which is provided by the embodiment, is as shown in FIG. 6.

The step S601 is substantially the same as the step S301, and the step S603 to the step S604 are substantially the same as the step S303 to the step S304, which are not repeated herein; and the difference is that: the embodiment refines the step S302, and the specific description is as follows:

In sub-step S6021, the injection mold 42 with a cavity is pressed on the base 41, and the TSV chip 1 is positioned in the cavity.

The stress relief film layer 3 is laid on the base 41 in advance, and the injection mold 42 is closed after the TSV chip 1 is placed well; then, a pressing force is applied to the injection mold 42 from the outside, so that the injection mold 42 and the base 41 are pressed together.

In sub-step S6022, the softened molding compound 5 is injected into the cavity to clad the TSV chip 1 with the molding compound 5.

Actually, the injection mold 42 is further provided with an injection gate 44 and an exhaust port 43. In this case, the injection gate 44 is used for injecting the softened molding compound 5 into the cavity, and the exhaust port 43 is used for discharging air in the cavity in the process of injecting the molding compound 5, so that the molding compound 5 can be full filled in the cavity to completely clad the TSV chip 1.

Compared to the first embodiment, the secondary packaging method of the TSV chip provided in the embodiment, provides a specific implementation mode for injecting the softened molding compound by using the injection mold to clad the TSV chip, and the injection mold is commonly used in the technical field and is simple and convenient in operation process.

A third embodiment of this disclosure relates to a secondary packaging method of a TSV chip. The third embodiment is a refinement on the first embodiment, and the main refinement is that: with reference to FIG. 8 and FIG. 9, the embodiment provides a second specific implementation mode for cladding the TSV chip via softened molding compound, i.e., a method of directly coating and pressing.

Figure 8:
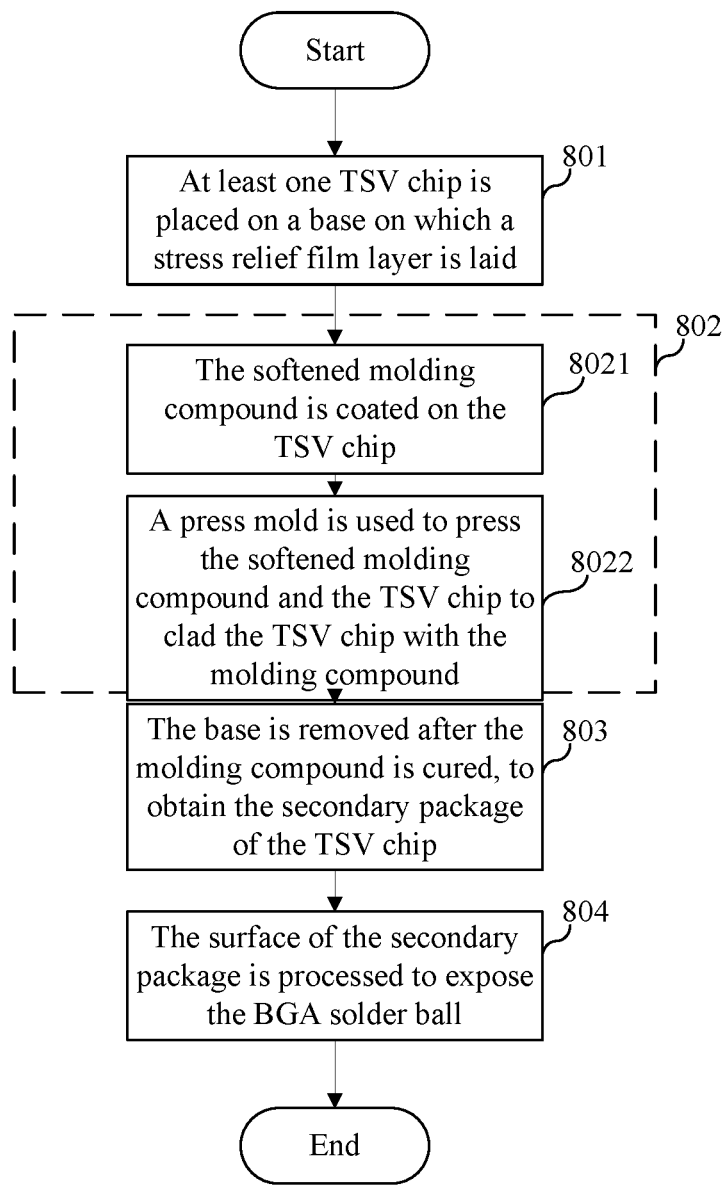
FIG. 8 is a specific flow chart of a secondary packaging method of a TSV chip according to a third embodiment of this disclosure.

The specific flow of the secondary packaging method of the TSV chip provided in the embodiment is as shown in FIG. 8.

The step S801 is substantially the same as the step S301, and the step S803 to the step S804 are substantially the same as the step S303 to the step S304, which are not repeated herein; and the difference is that: the embodiment refines the step S302, and the specific description is as follows:

In step S8021, the softened molding compound 5 is coated on the TSV chip 1.

In the embodiment, after the TSV chip 1 is placed on the base 41 on which the stress relief film layer 3 is laid, the softened molding compound 5 is directly coated on the TSV chip 1.

In step S8022, a press mold 45 is used to press the softened molding compound 5 and the TSV chip 1 to clad the TSV chip with the molding compound 5.

Figure 9:
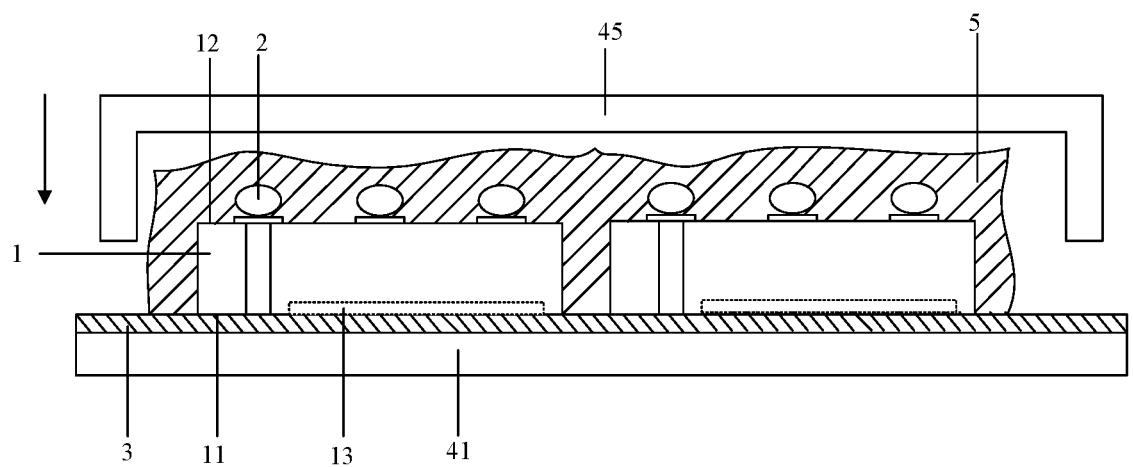
FIG. 9 is a structural schematic diagram of a second specific implementation mode for cladding the TSV chip via a softened molding compound according to the third embodiment of this disclosure.

In the embodiment, the press mold 45 presses according to a direction shown by an arrow in FIG. 9 and the redundant molding compound may overflow during the press process. After press, the molding compound 5 completely dads the five surfaces of the TSV chip 1 except for the forward surface 1 and full fills gaps among a plurality of TSV chips, and a flat glue surface can be obtained after the molding compound is cured.

It should be noted that the press mold 45 in the embodiment may have no injection gate and exhaust port, and the technical solution in the embodiment can be implemented by directly utilizing a press effect of the press mold 45.

It can be seen from the above-mentioned analysis that: the embodiment and the second embodiment of this disclosure respectively provide a specific implementation mode of cladding the TSV chip via softened molding compound; and the difference is that: in the second embodiment, according to the secondary packaging method of the TSV chip, the softened molding compound is injected into the injection mold to clad the TSV chip; while in this embodiment, the softened molding compound is directly coated on the surface of the TSV chip and pressed by utilizing the press mold. In actual applications, any method can be selected, and the embodiment does not make any limit thereto.

Compared to the first embodiment, the secondary packaging method of the TSV chip provided by the embodiment provides a cladding mode of directly coating the softened molding compound on the TSV chip and pressing by utilizing the press mold; the press mold is commonly used in the technical field and is simple and convenient in operation process.

Figure 10:
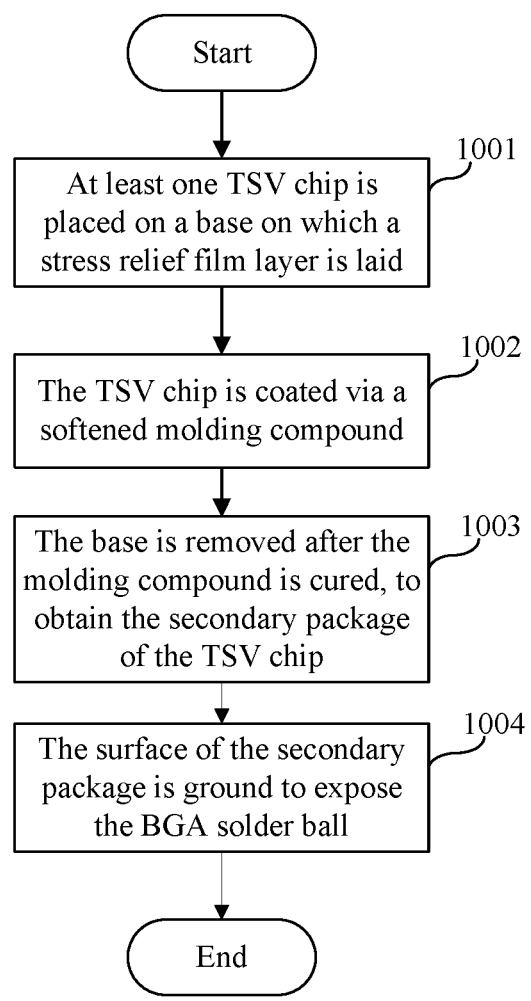
FIG. 10 is a specific flow chat of a secondary packaging method of a TSV chip according to a fourth embodiment of this disclosure.
Figure 11A:
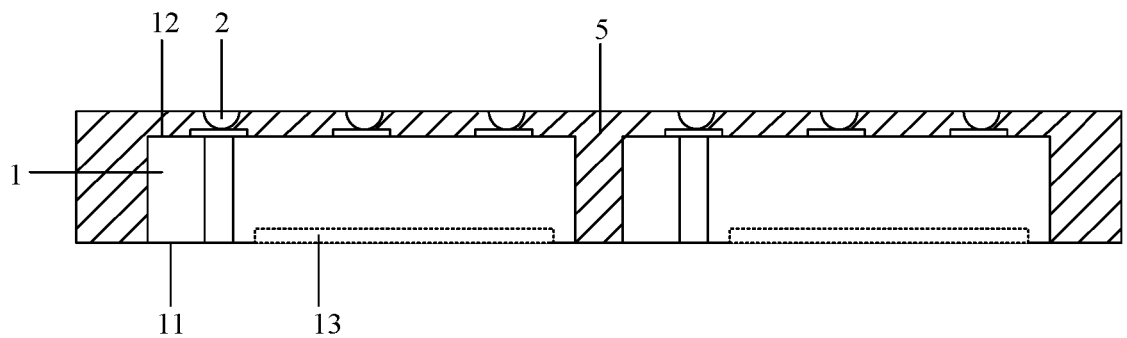
FIG. 11A is a structural schematic diagram of a first specific implementation mode for grinding a surface of a secondary package to expose a BGA solder ball according to the fourth embodiment of this disclosure.
Figure 11B:
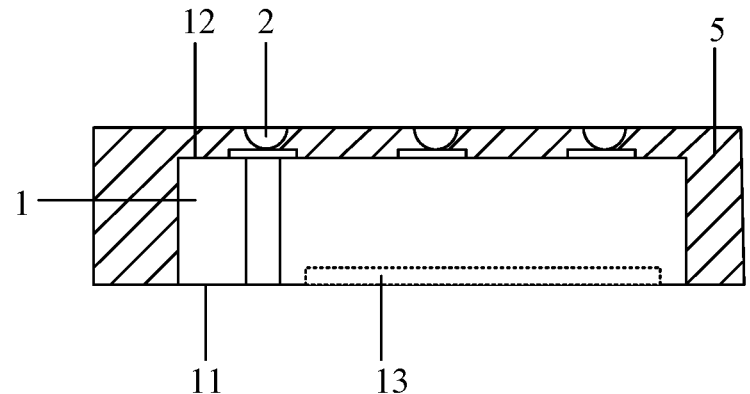
FIG. 11B is a sectional schematic diagram of a single unit of the secondary package of the TSV chip according to the fourth embodiment of this disclosure.

A fourth embodiment of this disclosure relates to a secondary packaging method of a TSV chip. With reference to FIG. 10, FIG. 11A and FIG. 11B, the embodiment provides a first specific implementation mode for processing a surface of a secondary package to expose a BGA solder ball.

The specific flow of the secondary packaging method of the TSV chip provided in the embodiment is as shown in FIG. 10.

The step S1001 to the step S1003 are substantially the same as the step S301 to the step S303, and are not repeated herein; and the difference is that: the embodiment refines the step S304, and the specific description is as follows:

In the step S1004, grinding is performed on the surface of the secondary package to expose the BGA solder ball.

Since the BGA solder ball 2 is still buried inside the cured molding compound 5, according to the embodiment, the cured molding compound is ground to expose the BGA solder ball 2.

As shown in FIG. 11A, in practice, a part of the molding compound 5 and a part of the BGA solder ball 2 may be ground. In the grinding process, a mechanical head of a grinding device directly applies a pressure on a surface (i.e., a surface corresponding to the counter surface 12 of the TSV chip) of the secondary package, and the mechanical head rotates at a high speed after being powered up, so that a part of the surface of the secondary package may be ground and the BGA solder ball 2 is exposed, and a specific ground height actually depends on a height of the cured molding compound 5. The exposed area of the BGA solder ball 2 may be maximized, to improve reliability of electrical connection of the BGA solder ball 2 and the outside to the greatest extent. In the embodiment, by taking a circular BGA solder ball (i.e., the exposed surface of the BGA solder ball is of a circle shape) as an example, it is preferable to grind a half of the BGA solder ball 2, and in this way, the BGA solder ball 2 has a maximum exposed area. That is, in this case, a distance between the exposed area of the BGA solder ball 2 and the counter surface 12 of the TSV chip is equal to a radius of the circle. FIG. 11B shows a signal unit of the secondary package, which is obtained by cutting the secondary package of the plurality of TSV chips after grinding.

It is worth mentioning that the technical solution in the embodiment may be implemented on the basis of the second or third embodiment of this disclosure.

Compared to the first embodiment, the secondary packaging method of the TSV chip provided in the embodiment provides a first specific implementation mode for processing the surface of the secondary package to expose the BGA solder ball, and the grinding process is commonly used in the technical field and is simple and convenient to operate and low in cost.

Figure 12:
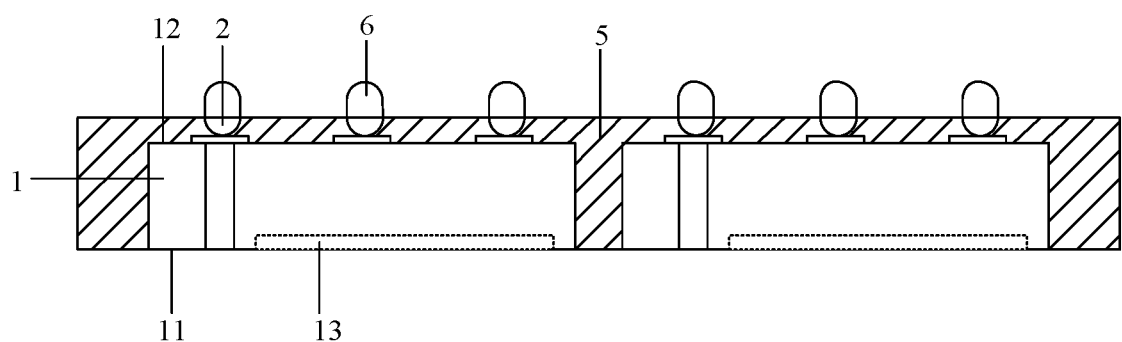
FIG. 12 is a sectional schematic diagram of a secondary package of a TSV chip, in which an auxiliary solder ball is disposed on a BGA solder ball, according to a fifth embodiment of this disclosure.
Figure 13:
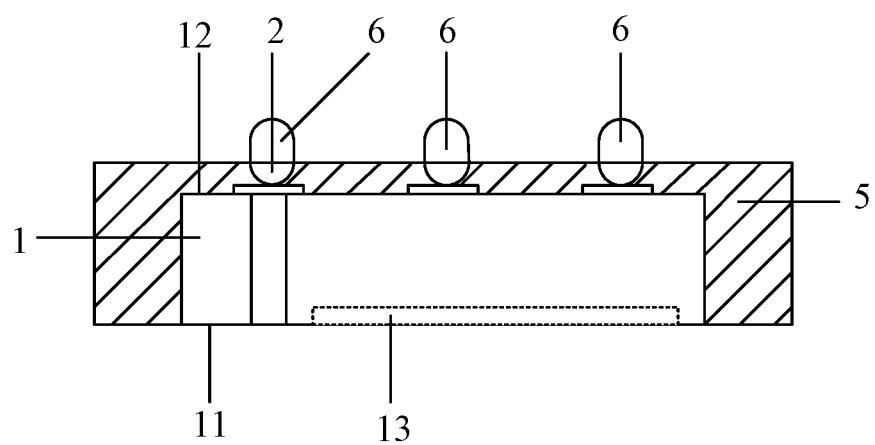
FIG. 13 is a sectional schematic diagram of a single unit of the secondary package of the TSV chip according to the fifth embodiment of this disclosure.

A fifth embodiment of this disclosure relates to a secondary packaging method of a TSV chip, the embodiment is an improvement on the fourth embodiment, and the main improvement is that: with reference to FIG. 12 and FIG. 13, after processing the surface of the secondary package to expose the BGA solder ball 2, the secondary packaging method further includes a step of disposing an auxiliary solder ball 6 on the BGA solder ball so as to further improve reliability of electrical connection between the BGA solder ball 2 and the outside.

In practice, in the case that the part of the BGA solder ball 2 is excessively ground or insufficiently ground in the grinding process, resulting in an insufficient area of the exposed surface of the BGA solder ball 2, or in the case that a maximized area of the exposed surface of the BGA solder ball 2 still cannot meet the actual design demand of the electronic product (i.e., the exposed area of the BGA solder ball 2 is still not big enough), the BGA solder ball 2 may be disposed with the auxiliary solder ball 6 thereon by adopting a silk-screen printing process, and the secondary package of the TSV chip is obtained after a solder reflowing process. The auxiliary solder ball 6 is above the surface of the secondary package, which is equivalent to increasing the exposed area of the BGA solder ball 2, so that the reliability of electrical connection between the BGA solder ball 2 and the outside is further improved. FIG. 13 shows a single unit of the secondary package of the TSV chip, which is obtained by cutting after disposing the auxiliary solder ball 6.

It is worth mentioning that the technical solution in the embodiment may be implemented on the basis of the second or third embodiment of this disclosure.

Compared to the fourth embodiment, the secondary packaging method of the TSV chip provided by the embodiment further improves the reliability of electrical connection between the BGA solder ball and the outside by adding the auxiliary solder ball.

A sixth embodiment of this disclosure relates to a secondary packaging method of a TSV chip. The sixth embodiment is a refinement on the first embodiment, and the main refinement is that: with reference to FIG. 14 and FIG. 15, the embodiment provides a second specific implementation mode for processing the surface of the secondary package to expose the BGA solder ball.

Figure 14:
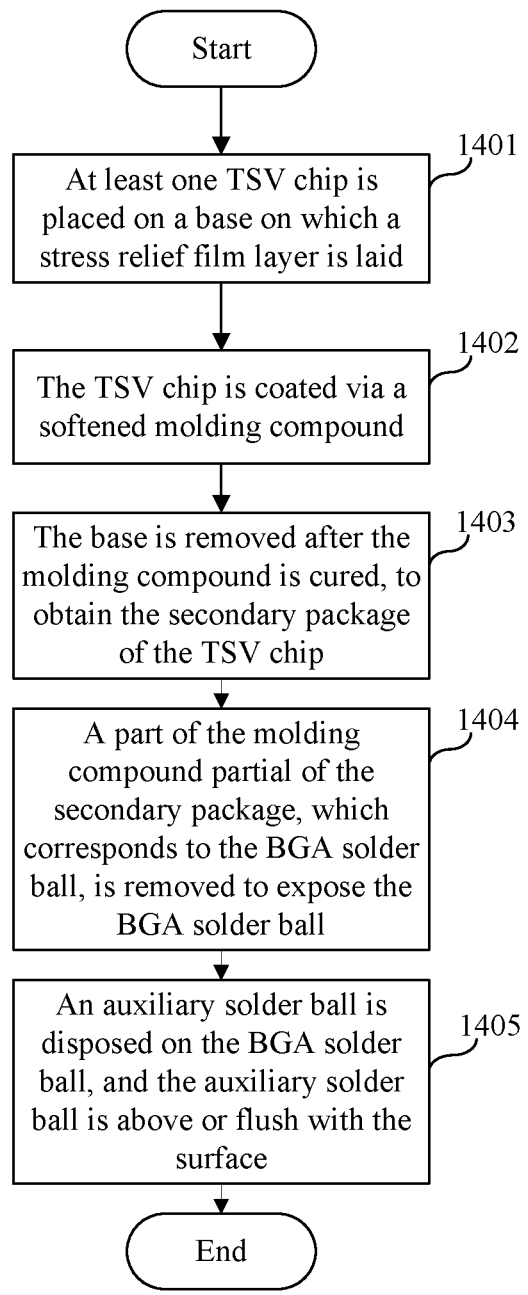
FIG. 14 is a specific flow chat of a secondary packaging method of a TSV chip according to a sixth embodiment of this disclosure.

The specific flow of the second packaging method of the TSV chip provided by the embodiment is as shown in FIG. 14.

The step S1401 to the step S1403 are substantially the same as the step S301 to the step S303, and are not repeated herein; and the difference is that: the embodiment refines the step S304, and adds a step S1405, and the specific description is as follows:

In the step S1404, a part of the molding compound partial of the secondary package, which corresponds to the BGA solder ball 2, is removed to expose the BGA solder ball 2.

Figure 15:
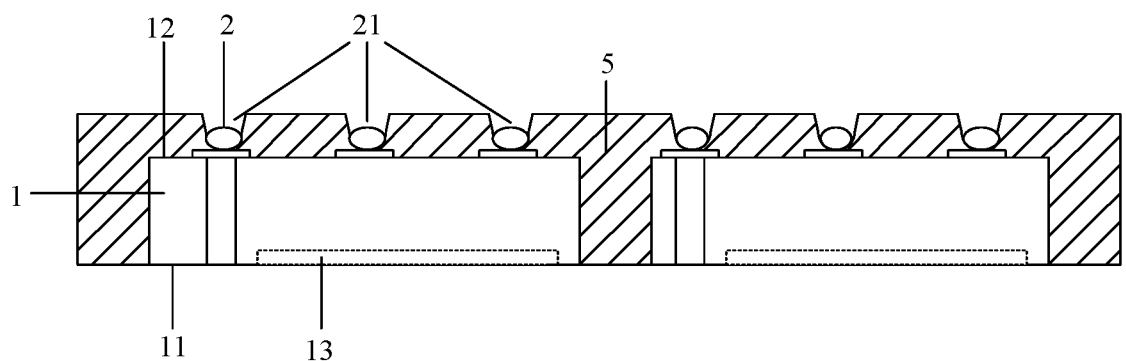
FIG. 15 is a structural schematic diagram of an implementation mode for partially removing the molding compound to expose a BGA solder ball according to the sixth embodiment of this disclosure.

As shown in FIG. 15, in the embodiment, the part of the molding compound may be removed by adopting one or any combination of a laser method, an ion bombardment method and a chemical corrosion method. Due to process characteristics, in the embodiment, only the part of the molding compound, which corresponds to the BGA solder ball 2, is removed, so that a cavity region 21 is formed above the BGA solder ball 2. These processes may be used for removing unwanted material in the secondary package, but not the BGA solder ball 2.

In the step S1405, an auxiliary solder ball 6 is disposed on the BGA solder ball, and the auxiliary solder ball 6 is above or flush with the surface.

Figure 16:
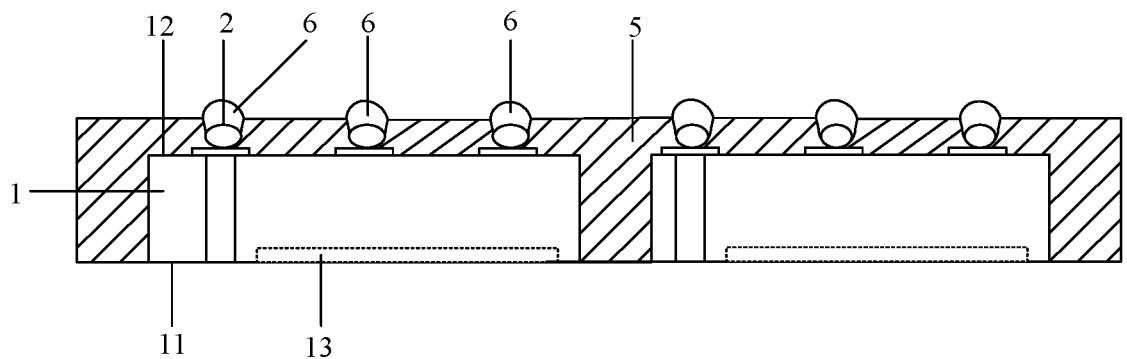
FIG. 16 is a structural schematic diagram of partially removing the molding compound and adding an auxiliary solder ball according to the sixth embodiment of this disclosure.
Figure 17:
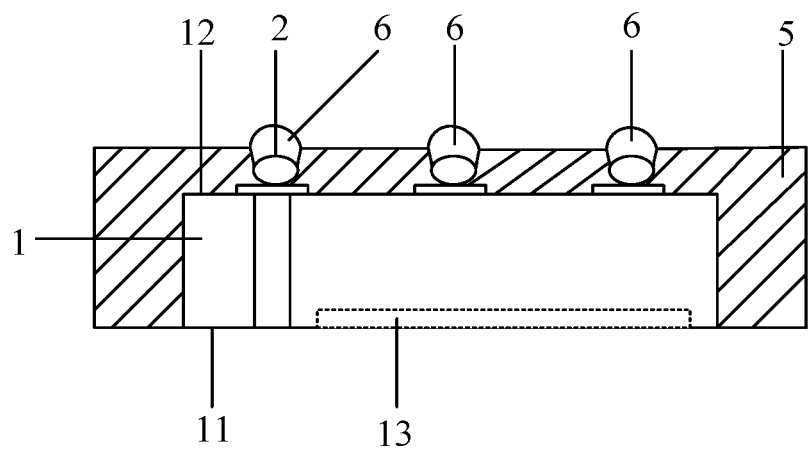
FIG. 17 is a sectional schematic diagram of a single unit of the secondary package of the TSV chip according to the sixth embodiment of this disclosure.

As shown in FIG. 16, since the exposed surface of the BGA solder ball 2 is lower than the surface of the secondary package, in the embodiment, the auxiliary solder ball 6 needs to be disposed and fills into the cavity region 21 corresponding to each BGA solder ball 2. In practice, it may adopt a silk-screen printing process to print solder into a cavity region, or a ball drop process to directly fill the cavity region 21 with a solder ball and a reflowing process to completely fill the cavity region 21. In the case of disposing the auxiliary solder ball 6, the auxiliary solder ball 6 shall be above or flush with the surface so as to facilitate the electrical connection between the secondary package and the outside. FIG. 17 shows a single unit of the secondary package of the TSV chip, which is obtained by cutting after disposing the auxiliary solder ball 6.

It can be seen from the above-mentioned analysis that: the embodiment and the fourth embodiment of this disclosure respectively provide a specific implementation mode for processing the surface of the secondary package to expose the BGA solder ball. The difference is that: firstly, in the fourth embodiment of this disclosure, for processing the surface of the secondary package, the grinding process is adopted, by which a part of the molding compound 5 and a part of the BGA solder ball 2 may be simultaneously ground, or only the molding compound 5 may be ground; however, in this embodiment, for processing the surface of the secondary package, only the part of the molding compound 5, which corresponds to the BGA solder ball 2, is removed, while leaving the BGA solder ball 2. Secondly, in the fourth embodiment of this disclosure, the auxiliary solder ball 6 may be used as an alternative; however, in this embodiment, the auxiliary solder ball 6 is necessary.

It is worth mentioning that the technical solution in the embodiment may also be implemented on the basis of the second or third embodiment of this disclosure.

Compared to the first embodiment, the second packaging method of the TSV chip provided by the embodiment provides a second specific implementation mode for processing the surface of the second package to expose the BGA solder ball, and the process of partially removing the molding compound and the process of disposing the auxiliary solder ball are commonly used in the technical field and very simple to implement.

The step division of various processes and methods above is just for clear description, and in practical operations, the steps can be merged into one step or some steps can be split to be decomposed into a plurality of steps.

A seventh embodiment of this disclosure relates to a secondary package of a TSV chip. With reference to FIG. 11A and FIG. 11B, the secondary package of the TSV chip includes: a TSV chip 1 and a molding compound 2; the TSV chip 1 has a forward surface 11, an counter surface 12 and a plurality of side surfaces; the counter surface 12 of the TSV chip 1 is disposed with a solder ball 2 thereon; and the molding compound 5 dads the counter surface 12 and the plurality of side surfaces of the TSV chip 1, and the solder ball 2 is exposed out of the surface of the molding compound 5.

In the embodiment, the TSV chip 1 is a fingerprint identification chip, and the forward surface 11 of the TSV chip 1 further includes a fingerprint identification sensing region 13. The solder ball includes a BGA solder ball 2, the BGA solder ball 2 is exposed out of the surface of the molding compound 5, and the exposed surface of the BGA solder ball 2 is flush with the surface of the molding compound 5, so that the BGA solder ball 2 may be electrically interconnected with the outside.

In practice, in the case of processing the surface of the secondary package of the TSV chip, a part of the molding compound and a part of the BGA solder ball may be removed by adopting a grinding process, so as to expose the BGA solder ball 2 of the surface of the molding compound 5.

Preferably, the exposed surface of the BGA solder ball 2 is of a circle shape, and a distance between the exposed surface of the BGA solder ball 2 and the counter surface 12 of the TSV chip 1 is equal to a radius of the circle, and in this case, the BGA solder ball 2 has a maximum area of the exposed surface, and the reliability of electrical connection between the BGA solder ball 2 and the outside is improved to the greatest extent.

Compared to the existing technology, according to the secondary package of the TSV chip provided by the embodiment, the secondary package in the non-substrate form can be obtained by employing the stress relief film layer and separating the secondary package of the TSV chip from the base on which the stress relief film layer is laid, after the molding compound is cured, so that based upon guaranteeing the TSV chip to have relatively high mechanical structural strength, the thickness of the secondary package of the TSV chip is reduced compared to that of a substrate packaging form, and the thinning and miniaturization design of an electronic product is facilitated.

An eighth embodiment of this disclosure relates to a secondary package of a TSV chip, the embodiment is substantially the same as the seventh embodiment, and the main difference is that: in the seventh embodiment of this disclosure, the solder ball includes the BGA solder ball 2, and the BGA solder ball 2 is exposed out of the surface of the molding compound 5, and the exposed surface of the BGA solder ball 2 is flush with the surface of the molding compound 5; however, in this embodiment, with reference to FIG. 13 or 17, the solder ball includes a BGA solder ball 2 and an auxiliary solder ball 6, the auxiliary solder ball 6 is exposed out of the surface of the molding compound 5, and the exposed surface of the auxiliary solder ball 6 is above or flush with the surface of the molding compound 5.

In the embodiment, the BGA solder ball 2 is connected to the counter surface 12 of the TSV chip, and after the secondary package is obtained, the surface of the secondary package of the TSV chip is processed to expose the BGA solder ball 2. In practice, the molding compound corresponding to the BGA solder ball 2 may be removed by adopting one or any combination of a laser method, an ion bombardment method and a chemical corrosion method. Due to process characteristics, the BGA solder ball is not removed by adopting these processes, and thus, in this case, the exposed surface of the BGA solder ball is lower than the surface of the secondary package, and the auxiliary solder ball 6 needs to be disposed on the BGA solder ball 2, to connect the BGA solder ball 2 with the auxiliary solder ball 6, and to expose the auxiliary solder ball 6 out of the surface of the molding compound 5, i.e., the exposed surface of the auxiliary solder ball 6 is above or flush with the surface of the molding compound 5.

Preferably, when the exposed surface of the auxiliary solder ball 6 is above the surface of the molding compound 5, the exposed surface of the auxiliary solder ball 6 is above the surface of the molding compound 5 by a distance of 50 μm to 300 μm, so that the auxiliary solder ball has the sufficient exposed area to ensure reliability of electrical connection with the outside, and meanwhile, a whole thickness of the secondary package of the TSV chip is as small as possible.

Compared to the seventh embodiment, the secondary package of the TSV chip provided by the embodiment provides a second specific implementation mode for the secondary package of the TSV chip, that is, the BGA solder ball is disposed with the auxiliary solder ball thereon, to increase the contact area between the BGA solder ball and the outside, so that the reliability of electrical connection is improved.

Those skilled in the art can understand that each of the above-mentioned embodiments is the specific embodiment for implementing this disclosure, but in practical applications, various changes can be made to the embodiments in form and in detail, without departure from the spirit and scope of this disclosure.

What is claimed is:

1. A secondary packaging method of a through silicon via (TSV) chip, comprising a through silicon via, wherein the TSV chip has a forward surface and a counter surface that are opposite to each other, the counter surface is disposed with a ball grid array (BGA) solder ball thereon, the through silicon via extends from the forward surface to the counter surface and is in electrical contact with the BGA solder ball, the secondary packaging method of the TSV chip comprising:

placing at least one TSV chip on a base on which a stress relief film layer is laid; wherein the forward surface of the TSV chip is in direct contact with the stress relief film layer;

cladding the entire exposed TSV chip via a softened molding compound;

curing the softened molding compound to form a cured molding compound, the cured molding compound surrounding and supporting the TSV chip as a secondary package of the TSV chip;

removing the base and the stress relief film layer from the TSV chip after the molding compound is cured, to expose the forward surface of the TSV chip and the TSV of the TSV chip; and processing a surface of the secondary package to expose the BGA solder ball; wherein the processed surface of the secondary package corresponds to the counter surface of the TSV chip;

wherein:

the step of placing comprises, an extended portion of the base and an extended portion of the stress relief film layer extending beyond a perimeter of the forward surface;

the step of cladding comprises, the softened molding compound directly contacting the extended portion of the stress relief film layer; and the step of removing comprises, removing the base and the stress relief film layer from the cured molding compound.

2. The secondary packaging method of the TSV chip according to claim 1, wherein the step of cladding the TSV chip via the softened molding compound specifically comprises:

pressing an injection mold with a cavity on the base, to position the TSV chip in the cavity; and injecting the softened molding compound into the cavity, to clad the TSV chip with the molding compound.

3. The secondary packaging method of the TSV chip according to claim 1, wherein the step of cladding the TSV chip via the softened molding compound specifically comprises:

coating the TSV chip with the softened molding compound; and pressing the softened molding compound and the TSV chip by utilizing a press mold, to clad the TSV chip with the molding compound.

4. The secondary packaging method of the TSV chip according to claim 1, wherein the step of processing the surface of the secondary package to expose the BGA solder ball specifically comprises:

grinding the surface of the secondary package to expose the BGA solder ball.

5. The secondary packaging method of the TSV chip according to claim 4, wherein the BGA solder ball has a circle shaped exposed surface, and a distance between the exposed surface of the BGA solder ball and the counter surface of the TSV chip is equal to a radius of the circle.

6. The secondary packaging method of the TSV chip according to claim 4, further comprising: disposing an auxiliary solder ball on the BGA solder ball after the step of processing the surface of the secondary package to expose the BGA solder ball; wherein the auxiliary solder ball is above the surface.

7. The secondary packaging method of the TSV chip according to claim 1, wherein the step of processing the surface of the secondary package to expose the BGA solder ball specifically comprises:

partially removing a part of the molding compound of the secondary package, which corresponds to the BGA solder ball, to expose the BGA solder ball;

the secondary packaging method further comprises: disposing an auxiliary solder ball on the BGA solder ball after the step of processing the surface of the secondary package to expose the BGA solder ball, and the auxiliary solder ball is above or flush with the surface.

8. The secondary packaging method of the TSV chip according to claim 7, wherein the step of partially removing a part of the molding compound of the secondary package comprises one or any of a laser method, an ion bombardment method and a chemical corrosion method.

9. The secondary packaging method of the TSV chip according to claim 1, wherein a plurality of TSV chips are provided, and the secondary packaging method further comprises: cutting the secondary package to obtain a single secondary package of a TSV chip, after the step of processing the surface of the secondary package to expose the BGA solder ball.

10. The secondary packaging method of the TSV chip according to claim 1, wherein:
the step of curing comprises, curing the softened molding compound to form a cured molding compound, the cured molding compound surrounding and supporting the TSV chip except for the forward surface of the TSV chip, as a secondary package of the TSV chip.

11. The secondary packaging method of the TSV chip according to claim 1, wherein:
the TSV chip is a fingerprint identification chip, and the forward surface of the TSV chip comprises a fingerprint identification sensing region; and
the removing step comprises, removing the base and the stress relief film layer from the TSV chip after the molding compound is cured, to expose the fingerprint identification sensing region of the TSV chip.

* * * * *